(12) United States Patent
Shimanuki

(10) Patent No.: US 6,307,440 B1
(45) Date of Patent: Oct. 23, 2001

(54) OSCILLATING CIRCUIT, AN OSCILLATOR FREQUENCY ADJUSTING METHOD, AND A TUNER

(75) Inventor: Masaru Shimanuki, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/533,502

(22) Filed: Mar. 23, 2000

(30) Foreign Application Priority Data

Mar. 26, 1999 (JP) .................................................. 11-084312

(51) Int. Cl.⁷ ....................................................... H03B 5/12
(52) U.S. Cl. .......................... 331/181; 336/123; 336/135; 334/171; 331/36 L; 331/108 D
(58) Field of Search ................................ 331/108 D, 36 L, 331/181; 334/74, 71; 336/134, 135, 138, 147, 120, 122, 123, 129

(56) References Cited

U.S. PATENT DOCUMENTS 6,101,371 * 8/2000 Barber et al. .......................... 455/73

FOREIGN PATENT DOCUMENTS

8046424 * 2/1996 (JP) .

* cited by examiner

*Primary Examiner*—Arnold Kinkead
(74) *Attorney, Agent, or Firm*—Lerner, David, Littenberg, Krumholz & Mentlik, LLP

(57) ABSTRACT

In an oscillator circuit employing a pattern coil on a printed-wiring circuit board as a resonator circuit, in order to satisfactorily adjust dispersion in oscillation frequencies, an air-core coil wound by 0.5 turn and less than one turn is provided so as to be connected to the pattern coil in parallel and mounted on the printed-wiring circuit board. The oscillation frequency is adjusted by adjusting the angle of the air-core coil relative to the printed-wiring board.

6 Claims, 4 Drawing Sheets

OSCILLATING CIRCUIT, AN OSCILLATOR FREQUENCY ADJUSTING METHOD, AND A TUNER

BACKGROUND OF THE INVENTION

The present invention relates to an oscillator circuit, an oscillation frequency adjusting method of the oscillator circuit, a tuner, and an oscillation frequency adjusting method of a local oscillation circuit of the tuner suitable for use in a. digital satellite tuner or the like of a receiving apparatus for receiving a digital satellite broadcasting, for example.

A general digital-satellite-broadcasting receiving apparatus includes a digital satellite antenna, a digital satellites converter, a digital satellite tuner and so on. A digital. satellite broadcasting signal from a broadcasting satellite is received by the digital satellite antenna. The digital satellite converter converts this digital satellite broadcasting signal received by the digital satellite antenna to a low-frequency signal having a frequency, for example, ranging from 950 MHz to 2,150 MHz to amplify the latter, and then supplies a high-frequency reception signal thus obtained to the digital satellite tuner.

The digital satellite tuner selects a desired transponder from the high-frequency reception signal and demodulates analog base-band signals (I, Q). The tuner further carries out an A/D conversion of these I and Q signals and demodulates a digital signal by using a QPSK demodulator, thereby outputting the demodulated digital signal by a unit of 8 bits in parallel.

A digital satellite tuner shown in FIG. 1 has generally been proposed. The digital satellite tuner shown in FIG. 1 will be described. In FIG. 1, reference numeral 1 represents a high-frequency reception signal input terminal supplied with a high-frequency reception signal having a frequency ranging from 950 MHz to 2,150 MHz, for example from the digital satellite tuner. The high-frequency reception signal from the high-frequency reception signal input terminal 1 is supplied to one input terminal of a mixing circuit 5 for converting a frequency through a serial circuit formed by a high-pass filter 1a for removing, for example, an intermediate-frequency signal of 479.5 MHz, a high-frequency amplifier circuit 1b, a voltage-control type variable band-pass filter 2 for removing, for example, an image frequency signal, an adjacent transponder signal and so on to thereby allow passing of a desired signal out of signals having frequencies ranging from 950 MHz to 2,150 MHz, an automatic gain control circuit 3 and a high-frequency amplifier circuit 4.

Reference numeral 6 represents a voltage-control type variable frequency oscillator circuit forming a local oscillator 10. An oscillator at an output side of the voltage-control type variable frequency oscillator circuit 6 is supplied to one input terminal of a phase comparator circuit 7 forming a PLL circuit (phase locked loop circuit).

Reference numeral 8 represents a central processing unit (CPU) for controlling the receiving apparatus. The central processing unit 8 generates a channel selection signal having a frequency corresponding to a desired channel. This channel selection signal having the frequency corresponding to the desired channel is supplied from the central processing unit 8 to the other input terminal of the phase comparator circuit 7.

The phase comparator circuit 7 compares an oscillations signal from the voltage-control type variable frequency oscillator circuit 6 with the channel selection signal having a frequency corresponding to a desired channel to obtain an error signal at the output side. The phase comparator circuit 7 supplies the error signal obtained at the output side thereof to a control terminal of the voltage-control type variable frequency oscillator circuit 6 through a low-pass filter 9 and also supplies a control voltage corresponding to the channel selection signal obtained at the output side of the low-pass filter 9, to the variable band-pass filter 2 having a varicap and so on, whose capacitance value changes in response to the control voltage.

This arrangement allows the band-pass filter 2 to remove signals other than a desired signal, e.g., an image frequency signal, a next to adjacent transponder signal and so on.

The voltage-control type variable frequency oscillator circuit 6 controls a frequency of the oscillation signal in response to the error signal obtained at the output side of the low-pass filter 9. In the voltage-control type variable frequency oscillator circuit 6, reference numeral 6a represents an amplifier circuit unit and reference numeral 6b represents a resonator circuit unit.

In this case, the phase comparator circuit 7, the low-pass filter 9 and voltage-control type variable frequency oscillator circuit 6 form the local oscillator 10 forming the PLL circuit.

A local oscillation signal from the local oscillator 10 is supplied to the other input terminal of the mixing circuit for converting a frequency. The mixing circuit 5 supplies its output signal to an intermediate-frequency output terminal 14 through a serial circuit formed by a surface acoustic wave filter 12 for passing an intermediate-frequency signal and an amplifier circuit 13. The analog base-band signals (I, Q) are demodulated from the intermediate-frequency signal supplied from the intermediate-frequency output terminal 14, and A/D conversion of the I and Q signals are carried out to thereby carry out the QPSK demodulation.

In the prior art shown in FIG. 1, the mixing circuit 5, the amplifier circuit unit 6a of the voltage-control type variable frequency oscillator circuit 6, and the intermediate- frequency amplifier circuit 11 form an integrated circuit 15.

Since the prior art shown in FIG. 1 employs an upper side heterodyne, if a frequency of the high-frequency reception signal supplied to the one input terminal of the mixing circuit 5 is A, e.g., 950 MHz to 2,150 MHz and a frequency of the intermediate-frequency signal is C, e.g., 479.5 MHz, then a frequency B of the oscillation signal of the local oscillator 10 is

B=A+C.

The frequency B of the oscillation signal of the local oscillator 10 ranges from 1,429 MHz to 2,629.5 MHz, and this range is a very high and wide band.

Since the oscillation signal of the local oscillator 10 of the above digital satellite tuner has a very high frequency and has a very wide band, there are such disadvantages that dispersion in characteristics of an oscillator circuit element, a resonator circuit and so on lead to dispersion in frequencies of the oscillation signal of the local oscillator 10.

SUMMARY OF THE INVENTION

In view of such aspects, it is an object of the present invention to propose an oscillator circuit and a tuner which can satisfactorily adjust the dispersion in oscillation frequencies.

An oscillator circuit according to the present invention is an oscillator circuit using a pattern coil on a printed-wiring circuit board. The oscillator circuit is arranged such that an air-core coil wound by 0.5 turn or more and less than one turn is connected to the pattern coil in parallel and mounted on the printed-wiring board, and an oscillation frequency is adjusted by adjusting an angle of the air-core coil relative to the printed-wiring board.

According to the present invention, since the air-core coil is connected to the pattern coil in parallel and mounted on the printed-wiring board, a coupling coefficient of induced inductance can be changed by changing the angle of the air-core coil relative to the printed-wiring board. Accordingly, the oscillation frequency can satisfactorily be adjusted without lowering a value Q of the resonator circuit.

According to the present invention, since the air-core coil is wound by 0.5 turn or more and less than one turn and a diameter of the air-core coil is larger than that of the pattern coil, when the air-core coil is mounted on the printed-wiring board, a boundary portion between a leg portion thereof and a coil portion thereof is used for positioning, which facilitates the positioning of the air-core coil.

A tuner according to the present invention is a tuner arranged such that a high-frequency reception signal is supplied to one input terminal of a mixing circuit and a local oscillation signal from a local oscillator circuit is supplied to the other input terminal of the mixing circuit to thereby obtain an intermediate-frequency signal at an output side of the mixing circuit. The tuner is arranged such that an air-core coil wound by 0.5 turn or more and less than one turn is connected to the pattern coil in parallel and mounted on the printed-wiring board, and an oscillation frequency is adjusted by adjusting an angle of the air-core coil relative to the printed-wiring board.

According to the present invention, since the pattern coil on the printed-wiring board is used as the resonator circuit of the local oscillator circuit and the air-core coil is connected to the pattern coil in parallel and mounted on the printed-wiring board, a coupling coefficient of induced inductance can be changed by changing the angle of the air-core coil relative to the printed-wiring board. Accordingly, the frequency of the local oscillator signal can satisfactorily be adjusted without lowering the value Q of the resonator circuit.

DETAILED DESCRIPTION

An example of an embodiment of an oscillator circuit and a tuner according to the present invention will hereinafter be described with reference to the accompanying drawings.

Figure 1:
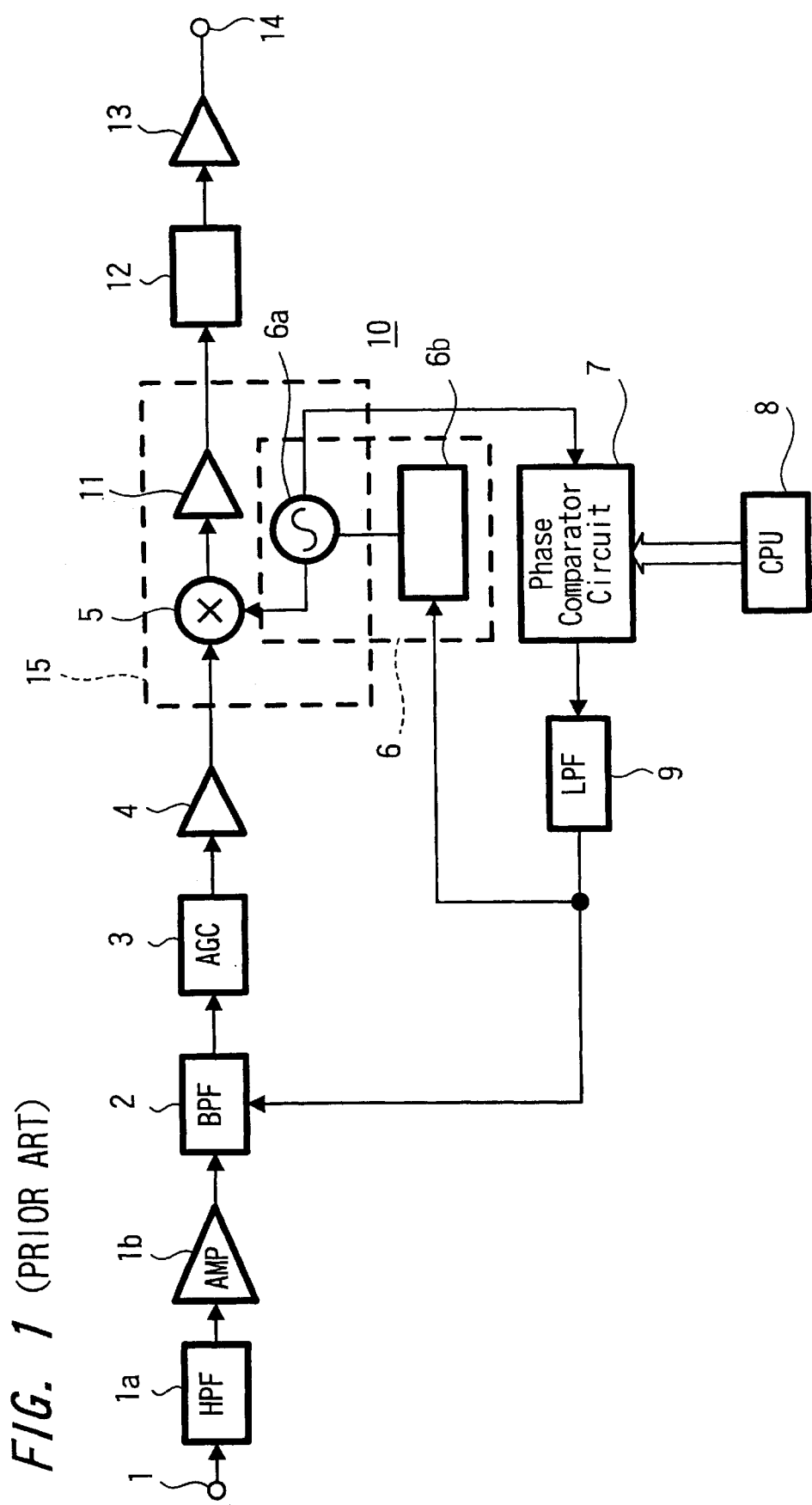
FIG. 1 is a structural diagram showing an example of a prior art digital satellite tuner.
Figure 2A:
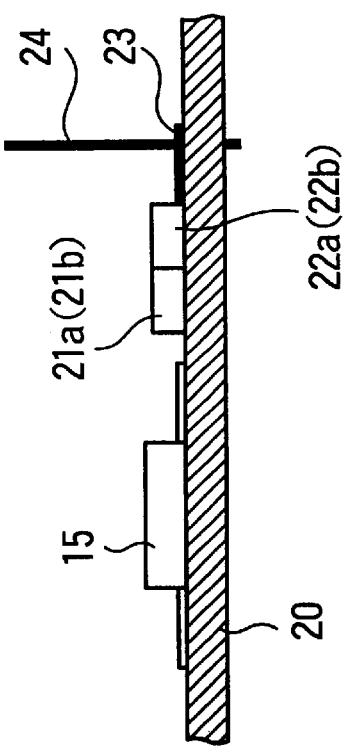
FIGS. 2A, 2B, 2C are structural diagrams showing an example of an embodiment of an oscillator circuit according to the present invention.
Figure 2C:
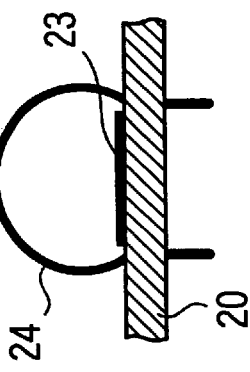
Figure 2B:
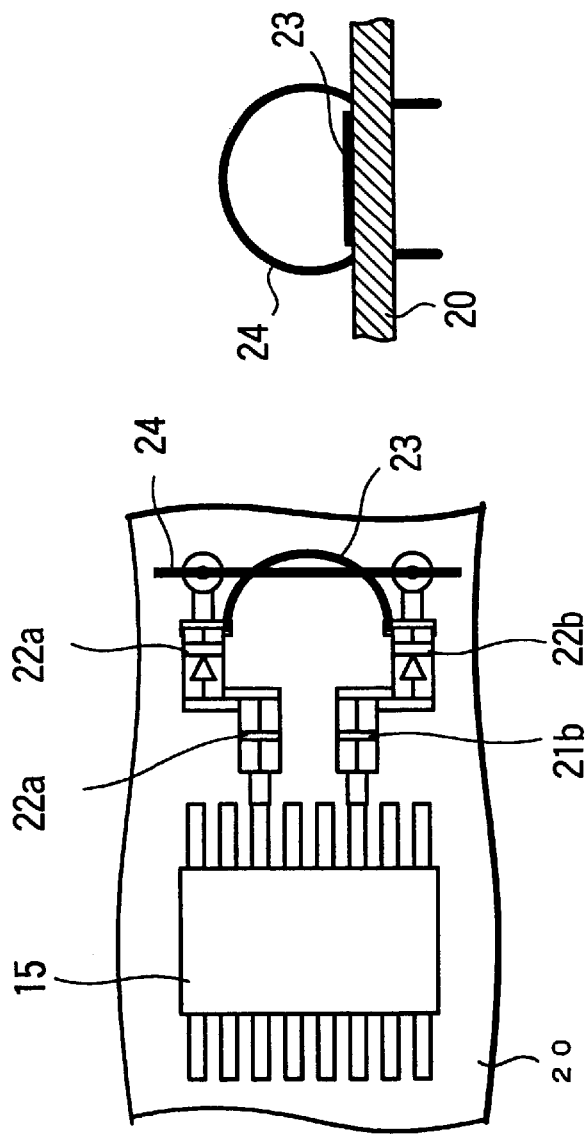

In this embodiment, a voltage-control type variable frequency oscillator circuit 6 forming a local oscillator 10 of a digital satellite tuner shown in FIG. 1 is arranged as shown in FIGS. 2A, 2B, 2C and FIG. 3. FIGS. 2A, 2B and 2C show an example in which parts forming the voltage-control type variable frequency oscillator circuit 6 according to this embodiment is mounted on a printed-wiring board 20. In FIGS. 2A and 2B, reference numeral 15 represents an integrated circuit forming a digital satellite tuner. As shown in FIG. 1, the integrated circuit 15 is provided with a mixing circuit 5 for converting a frequency, an amplifier circuit unit 6a of the voltage-control type variable frequency oscillator circuit 6 and an intermediate-frequency amplifier circuit 11.

In FIGS. 2A and 2B, reference numerals 21a and 21b represent capacitors forming a resonator circuit unit 6b of the voltage-control type variable frequency oscillator circuit 6. Reference numerals 22a and 22b represent varicaps whose capacitances change in response to supplied voltage values. Reference numeral 23 represents a substantially semicircular pattern coil formed by printing on the printed-wiring board 20 or the like.

In this embodiment, as shown in FIGS. 2A, 2B and 2C, a substantially semicircular adjustment air-core coil 24 wound by 0.5 turn or more and less than one turn is connected in parallel to the pattern coil 23 on the printed-wiring board 20, and mounted on the printed-wiring board 20 by inserting the ends thereof into apertures formed through the printed-wiring board 20 so as to be inclined at a right angle relative to the printed-wiring board.

In this case, an inductance value Lp of the pattern coil 23 is larger when the air-core coil 24 is inclined at a right angle relative to the printed-wiring board 20.

In this case, the diameter of the air-core coil 24 is larger than that of the pattern coil 23. If the diameter of the air-core coil 24 is larger than that of the pattern coil 23 and the air-core coil is wound by 0.5 turn or more and less than one turn, when the air-core coil 24 is attached to the printed-wiring board 20 by inserting the ends of the air-core coil 24 into the apertures of the printed-wiring board 20, then the boundary portion between leg portions and coil portions at the ends of the air-core coil is used for positioning the air-core coil when it is inserted into the apertures of the printed-wiring board 20.

Figure 3:
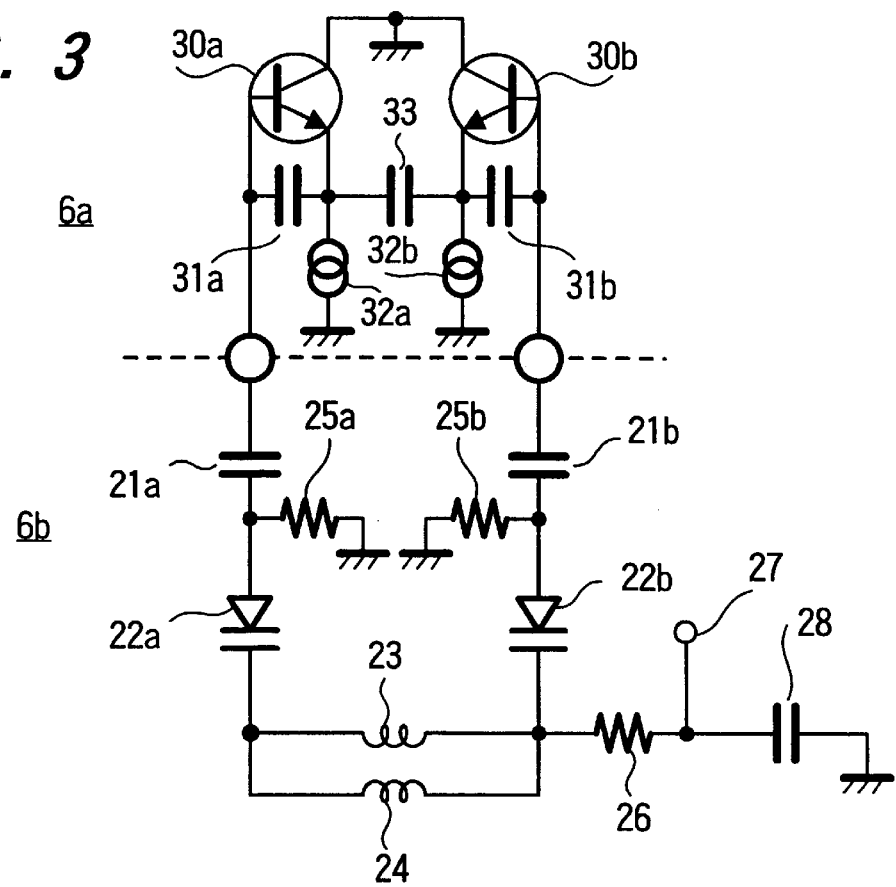
FIG. 3 is a diagram showing an example of an arrangement of the circuit shown in FIGS. 2A, 2B, 2C.

A circuit arrangement of parts shown in FIG. 2A, 2B, 2C is shown in FIG. 3 by way of an example. In explaining FIG. 3, reference numerals 30a and 30b represent npn type transistors forming the amplifier circuit unit 6a of the voltage-control type variable frequency oscillator circuit 6. Collectors of the transistors 30a and 30b are grounded. Emitters of the transistors 30a and 30b are grounded through constant-current circuit 32a, 32b, respectively. The emitters of the transistors 30a and 30b are connected to each other through a capacitor 33.

A capacitor 31a is connected between a base of the transistor 30a and the emitter thereof. A capacitor 31b is connected between a base of the transistor 30b and the emitter thereof. The base of the transistor 30a is connected to one end of the pattern coil 23 through a serial circuit formed by a capacitor 21a of the resonator circuit unit 6b and a varicap 22a. The base of the transistor 30b is connected to the other end of the pattern coil 23 through a serial circuit formed by a capacitor 21b of the resonator circuit unit 6b and a varicap 22b.

The air-core coil 24 is connected in parallel to the pattern coil 23. A connection point between the capacitor 21a and the varicap 22a is grounded through a resistor 25a, and a connection point between the capacitor 21b and the varicap 22b is grounded through a resistor 25b. A connection point between the varicap 22b and the pattern coil 23 is connected to a control-signal input terminal 27 supplied with the error signal from the low-pass filter 9, and a connection point between the control-signal input terminal 27 and the resistor 26 is grounded through a capacitor 28 for passing an alternating-current signal.

The circuit shown in FIG. 3 forms a differential oscillator circuit. Since the transistors 30a and 30b oscillates in a reverse phase, a potential at a middle point between the pattern coil 23 and the air-core coil 24 on the printed-wiring board 24 becomes the same as that at the grounded point (ground). A potential at the capacitor 33 forming a feed-back circuit becomes the same as that at the grounded point (ground).

Figure 4:
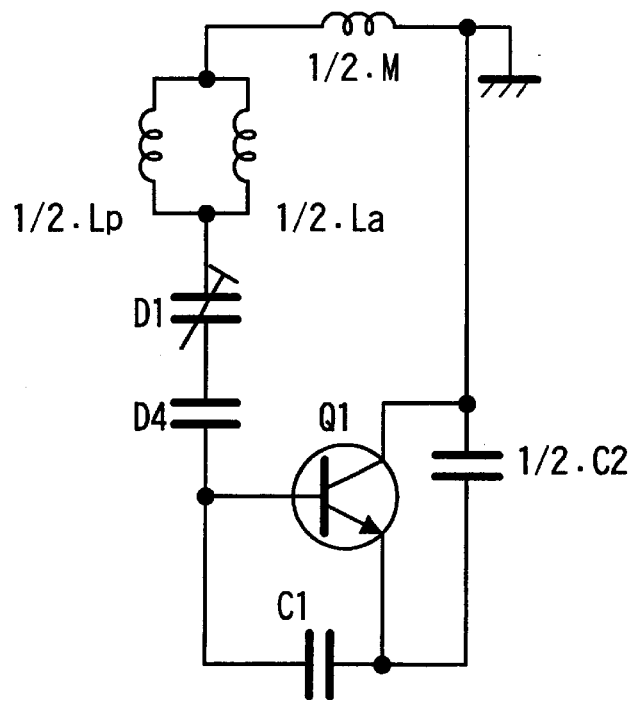
FIG. 4 is a diagram showing connection in an equivalent circuit for the circuit shown in FIG. 3.

The circuit can be regarded as an equivalent circuit shown in FIG. 4 and hence as a Colpitts-type oscillator circuit, on the assumption that the transistors 30a and 30b shown in FIG. 3 are depicted by Q1, capacitance values of the capacitors 31a and 31b are C1, capacitance values of the capacitors 21a and 21b are C4, capacitance values of the varicaps 22a and 22b are D1, an inductance value of the pattern coil 23 is Lp, an inductance value of the air-core coil 24 is La, and an inductance value of the induced inductance is M.

In this case, the pattern coil 23, the capacitors 21a and 21b, the capacitors 31a and 31b and the capacitor 33 have fixed constants. However, these are practically fluctuated due to inherent fluctuation of parts and dispersion in pattern width.

In this embodiment, an amount of change due to the above fluctuation is compensated by adjusting an angle of the adjustment air-core coil 24 relative to the printed-wiring board 20. Specifically, in the equivalent circuit shown in FIG. 4, the inductance value La of the air-core coil 24 has a relationship of differential connection to the inductance value Lp of the pattern coil 23. This relationship is expressed by the induced inductance M in the equivalent circuit shown in FIG. 4.

The induced inductance M acts to let the inductance values La and Lp cancel each other. An inductance value L of the resonator circuit unit 6b is as follows:

$$L = \frac{1}{\frac{1}{La} + \frac{1}{Lp}} - \frac{M}{2} \quad \text{[Equation 1]}$$

In this case, since in this embodiment the air-core coil 24 is connected to the pattern coil 23 in parallel, a resistance value of a coil of the resonator circuit is lowered. Accordingly, the values Q of the pattern coil 23 and the resonator circuit are prevented from being lowered.

Since in this embodiment a diameter of the air-core coil 24 is larger than a diameter of the pattern coil 23, change of the inductance value can be smaller as compared with change of the angle of the air-core coil 23 relative to the printed-wiring board 20, which permits fine adjustment of the oscillation frequency.

Figure 5A:
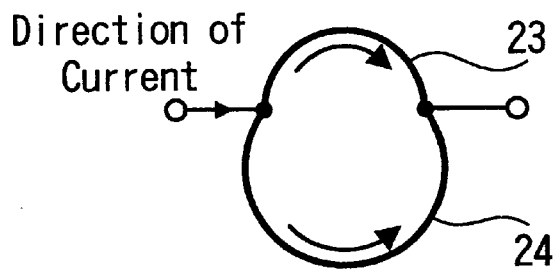
FIGS. 5A, 5B are diagrams used to explain the present invention.
Figure 5B:
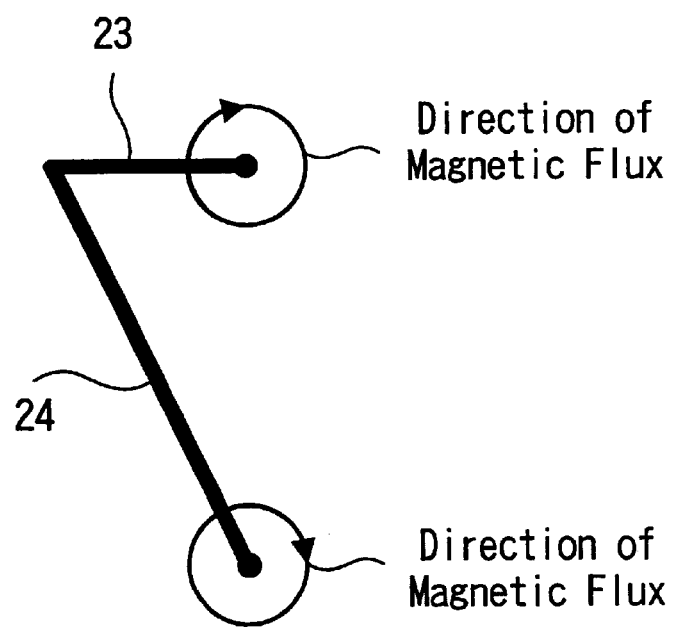

There will subsequently be described a principle with reference to FIGS. 5A and 5B that the inductance value Lp of the pattern coil 23 is changed when the angle of the air-core coil 24 relative to the printed-wiring board 20 is changed. In FIG. 5A, an upper-side semicircular coil (0.5 turns) represents the pattern coil 23, and a lower-side coil wound by 0.5 turns or more and less than one turn is the air-core coil 24.

When, as shown in FIG. 5A, a current flows in the rightward direction from the left, a counterclockwise magnetic flux is produced according to Fleming's left-hand rule. In this case, if the angle of the air-core coil 24 relative to the pattern coil 23 is smaller than 90°, a magnetic flux produced at the air-core coil 24 is produced in a direction reverse to that of a magnetic flux produced at the pattern coil 23 as shown in FIG. 5B and hence acts to cancel the magnetic flux produced by the pattern coil, which increases a coupling coefficient K.

If the air-core coil 24 is positioned perpendicularly to the pattern coil 23, then the magnetic flux of the air-core coil 24 is perpendicular to the magnetic flux of the pattern coil 23 and hence the coupling coefficient K is lowered to 0. The relationship between the induced inductance M and the coupling coefficient K is as follows:

$$M = K \sqrt{La.Lp} \quad \text{Equation 2}$$

According to this embodiment, since the air-core coil 24 is connected in parallel to the pattern coil 23 on the printed-wiring board 20 and mounted on the printed-wiring board 20, the coupling coefficient K of the induced inductance M can be changed by changing the angle of the air-core coil 24 relative to the printed-wiring board 20. Therefore, it is possible to satisfactorily adjust the oscillation frequency without lowering a value Q of the resonator circuit.

According to the present embodiment, since the adjustment air-core coil 24 is wound by 0.5 turn or more and less than one turn and a diameter of the air-core coil 24 is larger than that of the pattern coil 23, when the air-core coil 24 is fitted to the printed-wiring board 20, an interval between the legs thereof becomes shorter than the diameter of the air-core coil 24. Therefore, a boundary portion between a leg portion thereof and a coil portion thereof serves as a stopper, which facilitates the positioning of the air-core coil.

According to the present invention, since the oscillation frequency can be adjusted finely, it becomes unnecessary to carry out processing such as suppressing vibration by gluing the coil of the resonator circuit with an adhesive or the like.

When the present embodiment is used in a digital satellite tuner, it is possible to receive a digital satellite broadcast in which the adjustment air-core coil 24 can finely adjust the coupling coefficient K of the induced inductance M, i.e., the frequency of the local oscillation signal, in which tracking with a variable band-pass filter (tuning circuit) and a trap circuit, etc. can be adjusted optimally, and in which disturbance removal characteristics are satisfactory.

Having described preferred embodiments of the present invention with reference to the accompanying drawings, it is to be understood that the present invention is not limited to the above-mentioned embodiments and that various changes and modifications can be effected therein by one skilled in the art without departing from the spirit or scope of the present invention as defined in the appended claims.

What is claimed is:

1. An oscillator circuit comprising:
   a printed-wiring circuit board;
   a pattern coil arranged to be a resonator circuit mounted on said printed-wiring circuit board;
   an air-core coil wound by between 0.5 turn and less than one turn and mounted on said printed-wiring circuit board so as to form an angle between said air-core coil and said printed-wiring circuit board, said air-core coil being connected in parallel to said pattern coil and having a diameter larger than a diameter of said pattern coil, said angle being adjustable for adjusting an oscillation frequency of said oscillator circuit.

2. An oscillator circuit, comprising:
   a printed-wiring circuit board having a pair of apertures;
   a pattern coil arranged to be a resonator circuit mounted on said printed-wiring circuit board;

an air-core coil wound by between 0.5 turn and less than one turn and having a pair of ends, said air-core coil being mounted on said printed-wiring circuit board so as to form an angle between said air-core coil and said printed-wiring circuit board and being connected in parallel to said pattern coil, said air-core coil being attached to said printed-wiring circuit board by inserting said pair of ends of said air-core coil into said pair of apertures of said printed-wiring circuit board to form a boundary portion between said pattern coil and said pair of ends of said air-core coil for positioning said air-core coil, said angle being adjustable for adjusting an oscillation frequency of said oscillator circuit.

3. A method for adjusting an oscillation frequency in an oscillator circuit using a pattern coil on a printed-wiring circuit board as a resonator circuit, comprising:

mounting an air-core coil on said printed-wiring circuit board so as to form an angle between said air-core coil and said printed-wiring circuit board, said air-core coil being wound by between 0.5 turn and less than one turn and having a diameter larger than a diameter of said pattern coil;

connecting said air-core coil in parallel to said pattern coil; and adjusting said angle of said air-core coil relative to said printed-wiring circuit board.

4. A tuner for supplying a high-frequency reception signal to one input terminal of a mixing circuit and a local oscillation signal from a local oscillator circuit to another input terminal of said mixing circuit to thereby obtain an intermediate-frequency signal at an output of said mixing circuit, said tuner comprising:

a printed-wiring circuit board;

a pattern coil mounted on said printed-wiring circuit board, said pattern coil being arranged to be a resonator circuit of said local oscillator circuit; and an air-core coil wound by between 0.5 turn and less than one turn and mounted on said printed-wiring circuit board so as to form an angle between said air-core coil and said printed-wiring circuit board, said air-core coil being connected in parallel to said pattern coil and having a diameter larger than a diameter of said pattern coil, said angle being adjustable for adjusting a frequency of said local oscillation signal.

5. A tuner for supplying a high-frequency reception signal to one input terminal of a mixing circuit and a local oscillation signal from a local oscillator circuit to another input terminal of said mixing circuit to thereby obtain an intermediate-frequency signal at an output of said mixing circuit, said tuner comprising:

a printed-wiring circuit board having a pair of apertures;

a pattern coil mounted on said printed-wiring circuit board, said pattern coil being arranged to be a resonator circuit of said local oscillator circuit; and an air-core coil wound by between 0.5 turn and less than one turn and having a pair of ends, said air-core coil being mounted on said printed-wiring circuit board so as to form an angle between said air-core coil and said printed-wiring circuit board and being connected in parallel to said pattern coil, said air-core coil being attached to said printed-wiring circuit board by inserting said pair of ends of said air-core coil into said pair of apertures of said printed-wiring circuit board to form a boundary portion between said pattern coil and said pair of ends of said air-core coil for positioning said air-core coil, said angle being adjustable for adjusting a frequency of said local oscillation signal.

6. A method for adjusting an oscillation frequency of a local oscillation circuit in a tuner for supplying a high-frequency reception signal to one input terminal of a mixing circuit and a local oscillation signal from a local oscillator circuit to another input terminal of said mixing circuit to thereby obtain an intermediate-frequency signal at an output of said mixing circuit, said method comprising:

providing a printed-wiring circuit board having a pattern coil arranged to be a resonator circuit of said local oscillator circuit mounted thereon;

mounting an air-core coil on said printed-wiring circuit board so as to form an angle between said air-core coil and said printed-wiring circuit board, said air-core coil being wound by between 0.5 turn and less than one turn and having a diameter larger than a diameter of said pattern coil;

connecting said air-core coil in parallel to said pattern coil; and adjusting said angle of said air-core coil relative to said printed-wiring circuit board.

* * * * *